United States Patent
Blankenship et al.

(10) Patent No.: US 7,607,075 B2
(45) Date of Patent: Oct. 20, 2009

(54) METHOD AND APPARATUS FOR ENCODING AND DECODING DATA

(75) Inventors: Yufei Wu Blankenship, Streamwood, IL (US); T. Keith Blankenship, Streamwood, IL (US); Ajit Nimbalker, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 652 days.

(21) Appl. No.: 11/457,903

(22) Filed: Jul. 17, 2006

(65) Prior Publication Data

US 2008/0065956 A1    Mar. 13, 2008

(51) Int. Cl.
*G06F 11/00* (2006.01)
*H03M 13/03* (2006.01)

(52) U.S. Cl. ...................... 714/800; 714/790

(58) Field of Classification Search ................. 714/790, 714/800–801, 807
See application file for complete search history.

(56) References Cited

U.S. PATENT DOCUMENTS

| | | | |
|---|---|---|---|
| 7,260,763 B2 * | 8/2007 | Sukhobok et al. ............ | 714/758 |
| 2006/0242534 A1 * | 10/2006 | Livshitz ..................... | 714/758 |
| 2007/0136635 A1 * | 6/2007 | Niu et al. .................... | 714/752 |
| 2007/0180349 A1 * | 8/2007 | Jacobsen .................... | 714/776 |

OTHER PUBLICATIONS

Eli Shasha, et al., "Multi-Rate LDPC code for OFDMA PHY," Runcom Technologies Ltd., Jun. 25, 2004.
Dale Hocevar, et al., "LDPC Coding Scheme for OFDMA," Texas Instruments, Oct. 27, 2004.

* cited by examiner

*Primary Examiner*—Shelly A Chase

(57) ABSTRACT

A method and apparatus for encoding and decoding data is provided herein. During operation, A structured parity-check matrix H is provided to the encoder and decoder, where H is an m by n matrix and an expansion of a model matrix $H_{bm}$ of size $m_b$ by $n_b$, where $m=m_b \times z$ and $n=n_b \times z$. For a given code rate, multiple code sizes are accommodated by allowing both the model matrix size $n_b$ and the expansion factor z to vary.

20 Claims, 8 Drawing Sheets

FIG. 1

Example of circular shifting over factors of $z_0$ using a size-$z_0$ circular shift circuit.
Here $z_0 = 8$, $z = 4$, $q = 2$, $j = 2$. As shown, 2 copies of a size-4 vector are juxtaposed.
A 2-position circular shift over the size-8 vector produces the same result as a 2-position shift over a size-4 vector.

FIG. 2: High-level hardware diagram of a circular shift circuit.

FIG. 3: An equivalent circuit to that of Figure 2. In this case, the 8-to-1 multiplexers of Figure 2 are drawn equivalently in terms of 2-to-1 multiplexers.

FIG. 4: A simplified length-8 circular shift circuit.

FIG. 5: Circular shifting over lengths $DM$, where $1 \leq M \leq M_{max}$.

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

As described in U.S. patent application Ser. No. 10/839995, which is incorporated by reference herein, a low-density parity-check (LDPC) code is a linear block code specified by a parity-check matrix H. In general, an LDPC code is defined over a Galois Field GF(q), $q \geq 2$. If $q=2$, the code is a binary code. All linear block codes can be described as the product of a k-bit information block $S_{1 \times k}$ with a code generator matrix $G_{k \times n}$, to produce an n-bit codeword $x_{1 \times n}$, where the code rate is $r=k/n$. The codeword x is transmitted through a noisy channel, and the received signal vector y is passed to the decoder to estimate the information block $S_{1 \times k}$.

Given an n-dimensional space, the rows of G span the k-dimensional codeword subspace C, and the rows of the parity-check matrix $H_{m \times n}$ span the m-dimensional dual space $C \perp$, where $m=n-k$. Since $x=sG$ and $GH^T=0$, it follows that $xH^T=0$ for all codewords in subspace C, where "T" (or "$^T$") denotes matrix transpose. In the discussion of LDPC codes, this is generally written as $$Hx^T = 0^T, \qquad (1)$$

where 0 is a row vector of all zeros, and the codeword $x=[s\ p]=[s_0, s_1, \ldots, s_{k-1}, p_0, p_1, \ldots, p_{m-1}]$, where $p_0, \ldots, p_{m-1}$ are the parity-check bits; and $s_0, \ldots, s_{k-1}$ are the systematic bits, equal to the information bits within the information block.

During operation, a receiver obtains a contaminated version y of the transmitted codeword x. To decode y and determine the original information block s, an iterative decoding algorithm, such as belief propagation, is applied based on a bipartite graph. Soft information, usually in the format of log-likelihood ratio (LLR) of the codeword bits, is passed between the bank of variable nodes and the bank of check nodes. The iteration is stopped either when all check equations are satisfied or a maximum allowed iteration limit is reached.

The physical layer of a communication system must often be designed to provide higher layers (e.g., medium access control) the capability of transferring a wide range of packet sizes, and the physical layer forward error correction scheme must be designed accordingly. For instance, the rate-½ low-density parity-check (LDPC) code in IEEE 802.16e was defined over information block sizes k ranging from 36 to 144 bytes, inclusive, in 6-byte increments.

The structured LDPC codes in IEEE 802.16e and 802.11n are defined in terms of a "model" parity-check matrix and an "expansion factor" z, where the entries of the model matrix represent either the z×z null matrix or one of the z cyclic shift permutation matrices of size z×z. Thus, each row of the model matrix defines a vector of parity checks. With this structure an LDPC decoder can efficiently "evaluate" a vector of parity-check equations in parallel. Cyclic shifting of the soft information between the parity-check equations is an important aspect of the decoder. A high-throughput decoder must perform the shift in as few clock cycles as possible.

For a given code rate, the IEEE 802.16e and 802.11n LDPC codes accommodate multiple code sizes n by fixing the model matrix size and changing the expansion factor z to match the desired code sizes. This is referred to here as the "single-model" method. For example, in IEEE 802.16e nineteen 24-column model matrices are defined for z ranging from 24 to 96, inclusive, in increments of 4. Changing z changes the size of the vector of parity checks, and a vectorized decoder must hence support cyclic shifting over these vector sizes. Thus, in the single-model method a vectorized LDPC encoder and/or decoder will need to incorporate hardware for cyclic shifting over multiple vector sizes (i.e., one for each expansion factor). This greatly increases the complexity of the encoder and decoder. Therefore, a need exists for a method and apparatus for encoding and decoding data that reduces the amount of hardware necessary for cyclic shifting, yet allows for multiple code sizes to be utilized.

DETAILED DESCRIPTION OF THE DRAWINGS

To address the above-mentioned need, a method and apparatus for encoding and decoding data is provided herein. During operation, a structured parity-check matrix H is provided to the encoder and decoder. Binary matrix H is an m by n matrix and an expansion of a model matrix $H_{bm}$ of size $m_b$ by $n_b$, where $m=m_b \times z$ and $n=n_b \times z$. Model matrix size $n_b$ varies and expansion factor z varies for a given code rate, $1 \leq z \leq z_0$, to provide H matrices of different sizes.

The present invention encompasses a method for operating a transmitter that generates parity-check bits $p=(p_0, \ldots, p_{m-1})$ based on an information block $s=(s_0, \ldots, s_{k-1})$. The method comprises the steps of receiving the information block $s=(s_0, \ldots, s_{k-1})$, using a matrix H to determine the parity-check bits, and transmitting the parity-check bits along with the information block. Matrix H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes.

The present invention additionally encompasses a method for estimating a current symbol set $s=(s_0, \ldots, s_{k-1})$. The method comprises the steps of receiving a signal vector $y=(y_0, \ldots, y_{n-1})$ and using a matrix H to estimate the current symbol set $(s_0, \ldots, s_{k-1})$. Matrix H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies to provide H matrices of different size.

The present invention additionally encompasses an apparatus comprising logic circuitry receiving the information block $s=(s_0, \ldots, s_{k-1})$ and using a matrix H to determine the parity-check bits. Matrix H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes. The apparatus additionally comprises a transmitter transmitting the parity-check bits along with the information block.

The present invention additionally encompasses an apparatus comprising a receiver receiving a signal vector $y=(y_0, \ldots, y_{n-1})$ and logic circuitry using a matrix H to estimate the current symbol set $(s_0, \ldots, s_{k-1})$. Matrix H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies to provide H matrices of different size.

Multi-model Method

The binary matrix H is expanded from the model matrix $H_{bm}$ by replacing each entry of the model matrix with either the z×z null matrix or a z×z cyclic-shifted identity matrix. As discussed above, the single-model method has the potential advantage that only one mother model matrix per code rate needs to be stored for encoding and decoding as in IEEE 802.16e. However, varying the expansion factor z to obtain codes for different sizes n requires potentially complex cyclic shift hardware. Since the code size is $n=n_b \times z$, another method of obtaining codes for different code sizes n would be to vary the dimensions $n_b$ (and $k_b$) of the model matrix while keeping the rate $r=1-m_b/n_b=(n_b-m_b)/n_b=k_b/n_b$ constant. This solution is referred to here as the "multi-model" method, because the parity-check matrices H for codes of different sizes are derived from model matrices of different sizes. The expansion factor z can be constant or variable for a given code rate. This method has the disadvantage that multiple model matrices must be stored for encoding and decoding. However, since a single cyclic shift size (i.e., expansion factor) may be used for all code sizes n, the cyclic shift hardware for the multi-model method is simpler than for the single-model method. The cyclic shift hardware is explained in the next section.

Figure 1:
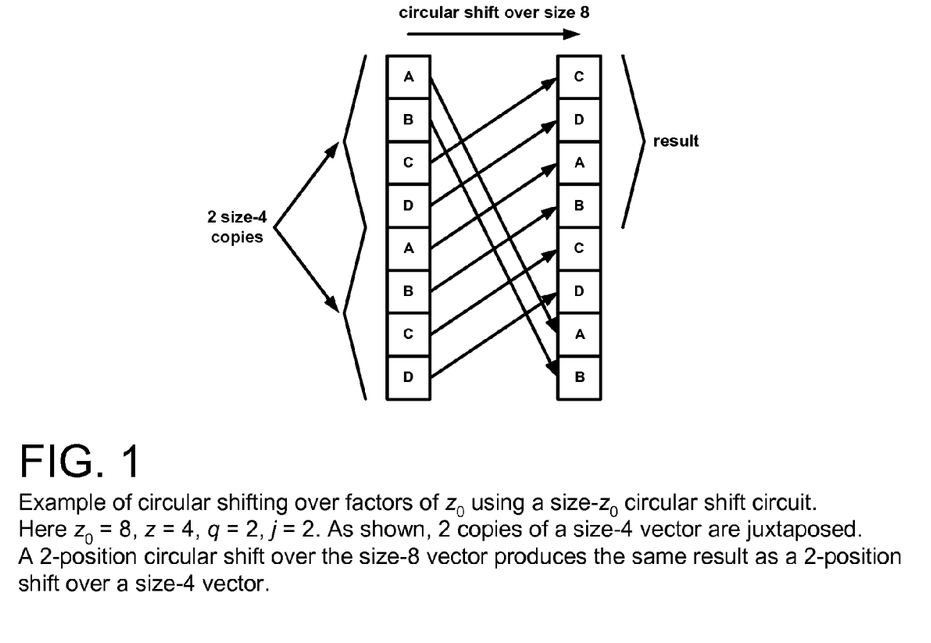
FIG. 1 through FIG. 5 illustrate cyclic shifting.

Although a fixed expansion factor (z) admits a much simpler cyclic shift circuit than a variable expansion factor, it may also lead to a coarse set of code sizes. In general, with the multi-model method for a rate-$l/(l+1)$ code, the size difference between consecutive code blocks is $(l+1) \times z$ bits. However, for the single-model method the size difference between consecutive code blocks is as small as $n_b$. In order to support a finer set of code sizes the multi-model method must allow the expansion factor z to vary in a controlled manner. Fortunately, a size-$z_0$ cyclic shift circuit also supports cyclic shifts over all sizes z that factor $z_0$ without additional complexity. In general, if $z_0 = z \times q$, where z and q are integers, a cyclic shift over size-z can be effected by juxtaposing q copies of the size-z vector to form a size-$z_0$ vector and performing the shift over the size-$z_0$ vector. A cyclic shift of the size-z vector by j positions is then obtained by cyclic shifting the size-$z_0$ vector by j positions and taking any of the q copies. An example of this property is shown in FIG. 1. In FIG. 1, $z_0=8$, $z=4$, $q=2$, and $j=2$. As shown, 2 copies of a size-4 vector are juxtaposed. A 2-position cyclic shift over the size-8 vector produces the same result as a 2-position shift over a size-4 vector. This property allows structured encoder/decoder designed to perform cyclic shifting over an expansion factor $z_0$ (i.e., vector size $z_0$) also to perform cyclic shifting for any structured matrix with an expansion factor z (i.e., vector size z) that is a factor of $z_0$.

Since a fixed-size ($z_0$) cyclic shift circuit supports all shift sizes that factor $z_0$ without extra hardware cost, the preferred way of applying the multi-model method is to choose factors of $z_0$ as candidates for expansion factors z. Thus for each H matrix, the expansion factor z is a factor of $z_0$. This implies that $z_0$ has multiple factors other than 1 and $z_0$. In order to provide more options for z, it is advantageous to use a $z_0$ value that has a large number of factors. For example, such values of $z_0$ can be chosen from the set of highly composite numbers. A positive integer is called a highly composite number if it has more divisors than any positive integer smaller than itself. The first few numbers in this set are {1, 2, 4, 6, 12, 24, 36, 48, 60, 120, 180, 240, 360, 720, 840, 1260}. For example, if an LDPC code is designed with an expansion factor $z_0=180$, then it can support any of the 18 expansion factors in {1,2,3,4,5,6,9,10,12,15,18,20,30,36,45,60,90,180}. In another example, $z_0$ can be chosen as a power of 2. Since all factors of $z_0$ are powers of 2, IEEE 802.16e-like model matrix scaling operation amounts to a simple right shift operation, and the modulo operation becomes a simple masking operation, if scaling or modulo is used to provide a model matrix from a mother model matrix.

As an example, Table 1 compares the model matrix dimensions, and the expansion factors z for the single- and multi-model methods for all the rate-¾ IEEE 802.16e code sizes. The table shows that the largest expansion factor z is $z_0=96$, which is therefore the number of parity-check circuits instantiated in the decoder and the maximum cyclic shift size utilized in the decoder. The parameters for the single-model method are as specified in IEEE 802.16e. For the multi-model method, for each code size the largest expansion factor z capable of producing a model matrix with the proper rate is chosen. Choosing the largest expansion factor z for each code size potentially maximizes the decoder throughput. Note that the alternate selections for the 1152-bit, 768-bit, and 576-bit code sizes are shown in parentheses, which has some advantages that will be discussed below. The example in Table 1 shows that to design the LDPC codes for a system, the multi-model method would use a set of possible $n_b$ values and a set of possible z values. For any given code size n, $n_b$ is a value taken from the set of possible values for $n_b$ and z is a value taken from a set of possible values of z. The expansion factor z varies with code size n, and the model matrix size $n_b$ varies with code size n.

TABLE 1

Single- and multi-model matrix dimensions for the rate-¾ IEEE 802.16e code sizes.

| Block Size | Single-Model (802.16e) | | | Multi-Model | | |
|---|---|---|---|---|---|---|
| | Rows | Columns | z | Rows | Columns ($n_b$) | z |
| 576 | 6 | 24 | 24 | 3 (6) | 12 (24) | 48 (24) |
| 672 | 6 | 24 | 28 | 7 | 28 | 24 |
| 768 | 6 | 24 | 32 | 2 (6) | 8 (24) | 96 (32) |
| 864 | 6 | 24 | 36 | 9 | 36 | 24 |
| 960 | 6 | 24 | 40 | 5 | 20 | 48 |
| 1056 | 6 | 24 | 44 | 11 | 44 | 24 |
| 1152 | 6 | 24 | 48 | 3 (6) | 12 (24) | 96 (48) |
| 1248 | 6 | 24 | 52 | 13 | 52 | 24 |
| 1344 | 6 | 24 | 56 | 7 | 28 | 48 |
| 1440 | 6 | 24 | 60 | 15 | 60 | 24 |
| 1536 | 6 | 24 | 64 | 4 | 16 | 96 |
| 1632 | 6 | 24 | 68 | 17 | 68 | 24 |
| 1728 | 6 | 24 | 72 | 9 | 36 | 48 |
| 1824 | 6 | 24 | 76 | 19 | 76 | 24 |
| 1920 | 6 | 24 | 80 | 5 | 20 | 96 |
| 2016 | 6 | 24 | 84 | 21 | 84 | 24 |
| 2112 | 6 | 24 | 88 | 11 | 44 | 48 |
| 2208 | 6 | 24 | 92 | 23 | 92 | 24 |
| 2304 | 6 | 24 | 96 | 6 | 24 | 96 |

A main disadvantage of the multi-model method is that it requires encoder/decoder storage of a large number of model matrices. For instance, in the rate-¾ example described above the single-model method requires storage of a single mother model matrix, whereas the multi-model method potentially requires storage of nineteen model matrices.

Fortunately, the number of model matrices can be reduced by two techniques. First, some matrices can be derived from a mother model matrix by operations that derive a model matrix $H_{bm}$ of one code size from a mother model matrix $H_{bm}$ of another code size. For instance, scaling and modulo operations are used by the single-model method in IEEE 802.16e. Similarly, for multi-model method, a model matrix $H_{bm}$ can be derived from a mother model matrix by scaling operations. For example, for the rate-¾ code discussed above, the largest code size is 2304 bits. To avoid designing and storing the model matrices for code sizes n of 1152-bit, 768-bit, and 576-bit, since these sizes factor 2304, their model matrices can be derived from the 2304-bit mother model matrix by an 802.16e-like scaling. That is, each shift size y of a smaller block is obtained from the corresponding shift size x of the mother model matrix according to $y=\text{floor}(x \times z_i/z_0)$, where $z_i$ is the cyclic shift vector size (equal to expansion factor) for the i-th smaller code block and $z_0$ is the cyclic shift vector size (equal to expansion factor) for the mother model matrix. Alternatively, a model matrix $H_{bm}$ can be derived from a mother model matrix by modulo operations. If 802.16e-like modulo scaling scheme is used, the relationship is $y=\text{mod}(x, z_i)$. The values in parentheses in Table 1 for these 1152-bit, 768-bit, and 576-bit blocks are parameters for model matrices that are derived from the 2304-bit model matrix by scaling or modulo. In general, model matrices of the first 7 code sizes (n=576 to 1152) can be derived from model matrices of 7 other code sizes (n=1152 to 2304) in Table 1. Thus a total of 13 code sizes can be defined using 7 model matrices, each with an expansion factor that factors into $z_0=96$.

When defined, a matrix H can be used to obtain a second H matrix via shortening and/or puncturing. In the example discussed above, after 13 code sizes are defined, the remaining 6 matrices (with code size n=1248 to 2208 with a step size 192) in Table 1 can be obtained via shortening and/or puncturing from another matrix H. Shortening and puncturing is a second technique that can be used to reduce the design/storage problem of the multi-model method. In this technique, a smaller-size code is obtained by using the parity-check matrix of a larger-size code. For the smaller size code, zeros are appended to the information block to match the information block size k of the next larger code. After encoding, the appended zeros along with some of the other code bits are punctured in order to achieve the desired rate. For instance, in the rate-¾ example presented above, the 2208-bit code would use the 2304-bit parity check matrix as follows. 72 zeros would be appended to the 1656-bit information block of the 2208-bit code to obtain the 1728-bit information block of the 2304-bit code. Encoding would proceed using the 2304-bit parity check matrix H. After encoding, the 72 appended zeros along with 24 of the other code bits would be punctured. In the rate-¾ example presented above, every other code size from n=1248 to 2208 could be derived from the next larger code block through shortening and puncturing. This would eliminate storage for 6 of the 19 matrices of the rate-¾ example above. Using shortening and puncturing to get one immediately lower code size will not sacrifice code performance significantly. Studies have shown that shortening and puncturing can be applied to the 802.16e code set to obtain two immediately lower code sizes without significant performance degradation.

Normally, the throughput of a structured decoder is proportional to the expansion factor z. Therefore, for a given code rate, with the single-model method the decoder throughput increases linearly with code size. However, with the multi-model method the decoder throughput may vary drastically with increasing code size. In fact, with the multi-model method smaller code sizes may achieve nearly the same throughput as larger code sizes. For example, in the multi-model rate-¾ code discussed above the 1920-bit block would achieve nearly the same throughput as the 2304-bit block since they both have expansion factor z=96.

Another disadvantage of the multi-model method is that it leads to an increase in power consumption. This occurs because the decoder keeps all the $z_0$ single parity-check (SPC) decoding circuits busy irrespective of the expansion factor z. However, it is clear that when $z<z_0$, it is sufficient to use only z SPC circuits to perform decoding. Essentially, in the multi-model method, the remaining ($z_0$-z) circuits duplicate the effort of the z SPC circuits to allow a fixed-size cyclic shifting (see FIG. 1). In methods that allow variable-size cyclic shifting, the redundant SPC circuits can be turned off to reduce power consumption.

When codes are designed for a particular system, compromises will typically be made between code performance, throughput, and decoding complexity. A comprehensive design strategy for supporting multiple code sizes using fixed-size cyclic shifting will seek the best compromise between the following aspects to achieve high throughput and good error-correcting performance while keeping the hardware complexity low:

(a) multiple model matrices with variable row/column dimensions;
(b) multiple expansion factors z which factor some maximum expansion factor $z_0$;
(c) model matrices that can be derived from a mother model matrix via a simple relation ship such as the scaling or modulo operation; and
(d) codes that can be obtained from larger codes via shortening and puncturing.

An example of the need for a comprehensive design approach can be seen in the example discussed above. In Table 1, the tabulated 1536-bit block has a small 4×16 model matrix with a large z=96. In this case, since z is large the decoding throughput would be high. However, codes with such a small model matrix would tend to have poor error correcting performance. A better choice would be to increase the matrix dimensions and decrease z, although throughput would suffer. In this case, an 8×16 model matrix with z=48 is expected to have better error correcting performance.

This example shows that, in general, there may be many combinations of z and model matrix row/column dimensions that all achieve the same code size. The method discussed here does not limit one to any particular combination. Any combination may be used in a particular application.

It should also be noted that the multi-model method may be applied to part of the system design to reduce the hardware cost. For example, code size granularity or other requirements may demand using some expansion factors that do not divide $z_0$.

It is also possible that the multi-model method is applied to several parts of the system design. For example, two different $z_0$ values may be used for one code rate, each covering a different set of expansion factors that divide $z_0$.

Cyclic Shift Hardware

The following discussion illustrates one way to efficiently implement the cyclic shift hardware. It is demonstrated that even with highly intelligent designs, the hardware that has to handle multiple vector sizes is much more costly than the hardware that only needs to handle one vector size. Thus using the multi-model method can significantly reduce the hardware cost than the single-model method, since the encoder/decoder performs cyclic shifting for multiple vector sizes using the cyclic shift circuitry of a single vector length.

Figure 2:
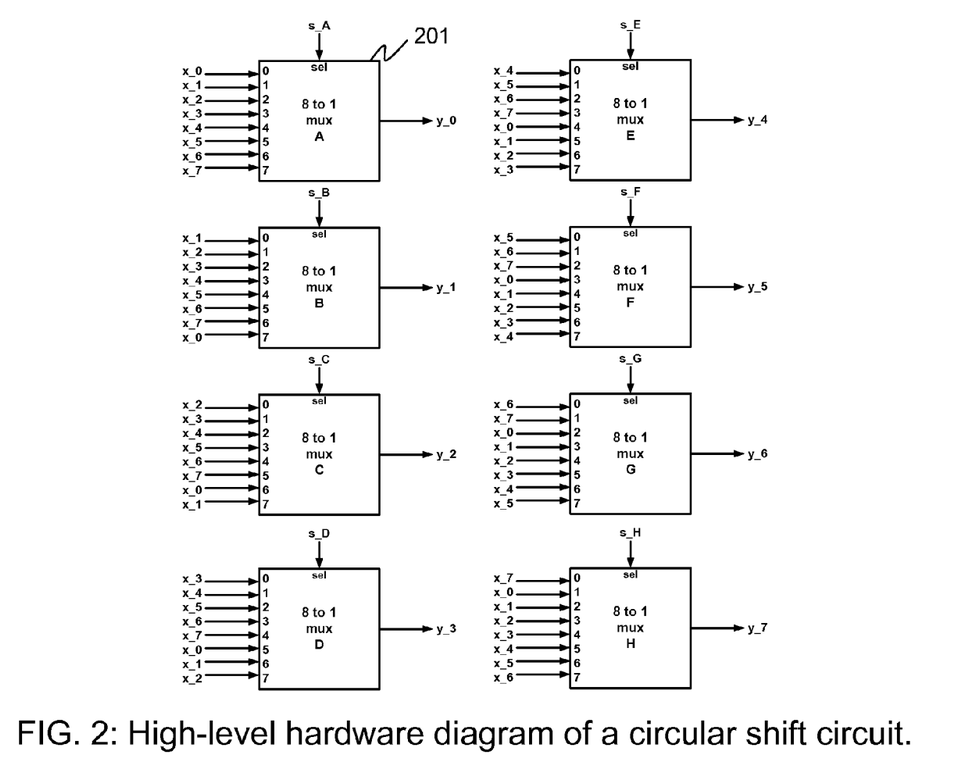

The purpose of cyclic shift hardware is to reorder a vector of quantities that feeds a vector of arithmetic units, where each quantity feeds exactly one arithmetic unit. To simplify the discussion, consider a vector of 8 quantities $x=(x\_0, x\_1, \ldots, x\_7)$ that must be cyclically shifted. Assume the shifted vector is $y=(y\_0, y\_1, \ldots, y\_7)$. As shown in FIG. 2, the cyclic shift can be performed by 8 8-to-1 multiplexers 201 (only one labeled). The multiplexers are hard wired with the 8 possible cyclic shifts, one of which is selected by setting all 3-bit select lines s_A, s_B, . . . , s_H to the desired shift (in binary). For instance, to shift x by 3 positions all select lines would be set to $(011)_2$.

Figure 3:
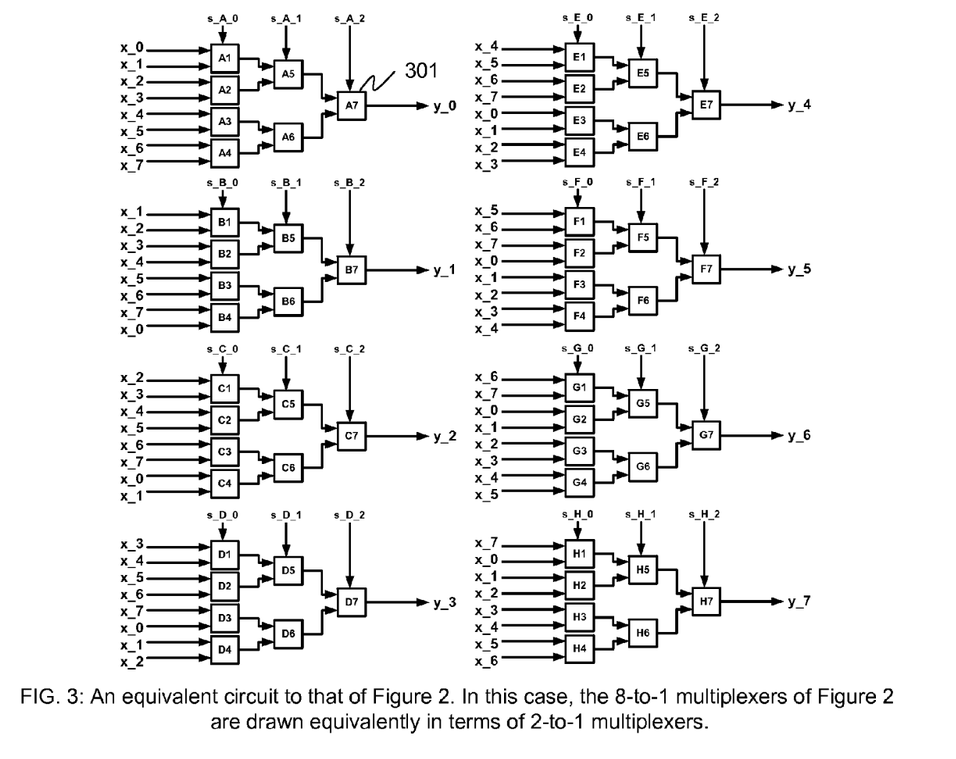

The 8-to-1 multiplexers 201 of FIG. 2 can be equivalently implemented with 2-to-1 multiplexers 301 (only one labeled) as shown in FIG. 3. However, FIG. 3 shows that when the select lines are all set identically, approximately half of the circuit is redundant. To see this, observe that the E3, E4, and E6 multiplexers are redundant with A1, A2, and A5. Both sets multiplex out the same element of the sub-vector ($x\_0,x\_1, x\_2,x\_3$). Similarly, the E1, E2, and E5 multiplexers are redundant with A3, A4, and A6. Both sets multiplex out the same element of the sub-vector ($x\_4,x\_5,x\_6,x\_7$). Continuing in this fashion, it is clear that only half of the first two levels of multiplexers are essential.

However, even more redundancy is present. Note from FIG. 3 that A1 is redundant with C4, A2 is redundant with C1, A3 is redundant with C2, and A4 is redundant with C3. In fact only one-quarter of the first level of multiplexers are essential. To generalize, a cyclic shift over a length-i vector can be performed with $i\lceil \log_2(i) \rceil$ 2-to-1 multiplexers. The simplified length-8 cyclic shift circuit is shown in FIG. 4.

Figure 4:
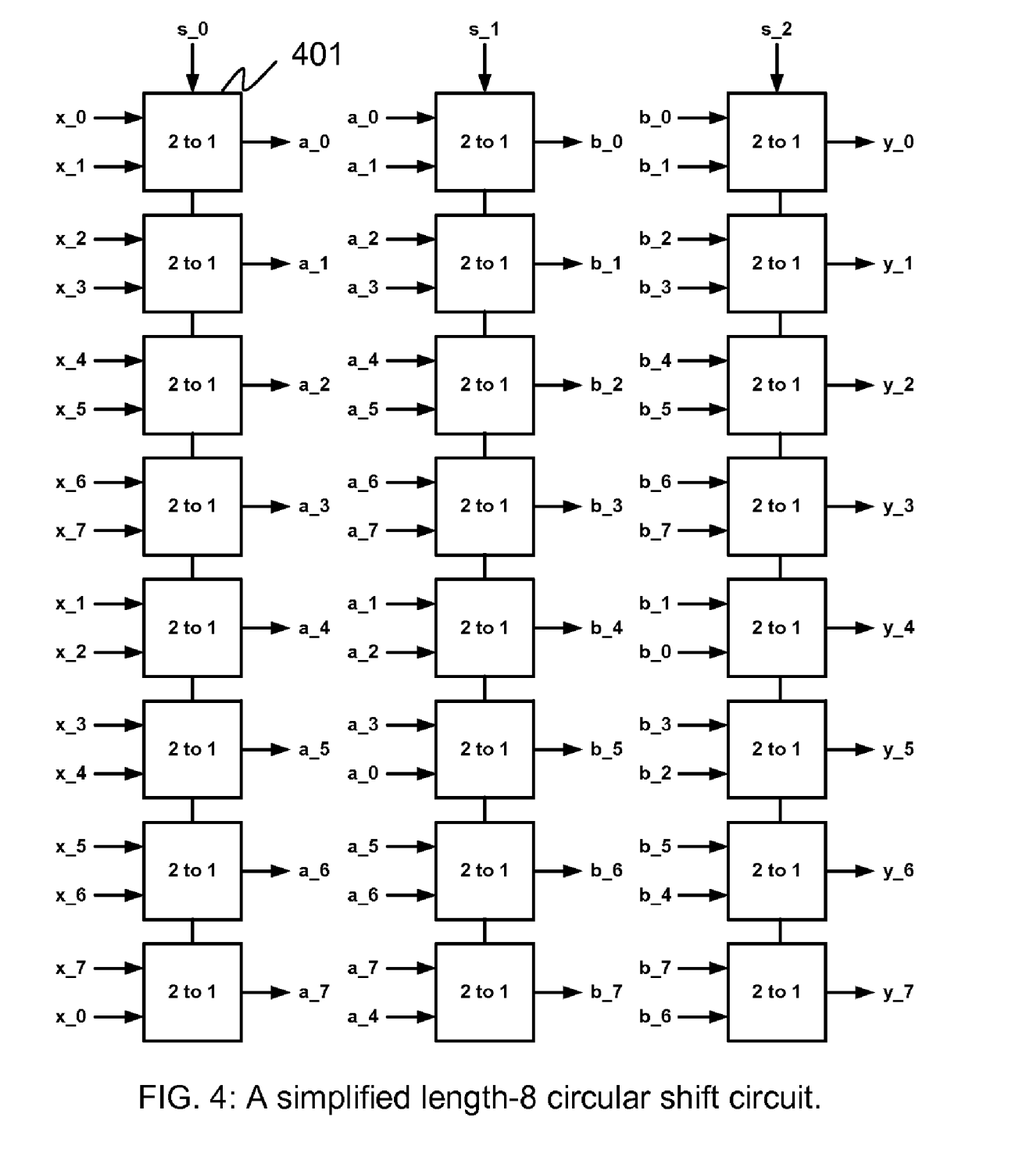

The simplification of the circuit of FIG. 3 into the circuit of FIG. 4 occurs because the multiplexer's select lines are identical at each level (i.e., s_A=s_B= . . . =s_H) in FIG. 3. The circuit of FIG. 3 is capable of handling arbitrary permutations, but in such cases the select lines at each level are no longer identical and the circuit therefore cannot be simplified. In general, $i(i-1)$ 2-to-1 multiplexers are needed for arbitrary permutations.

Figure 5:
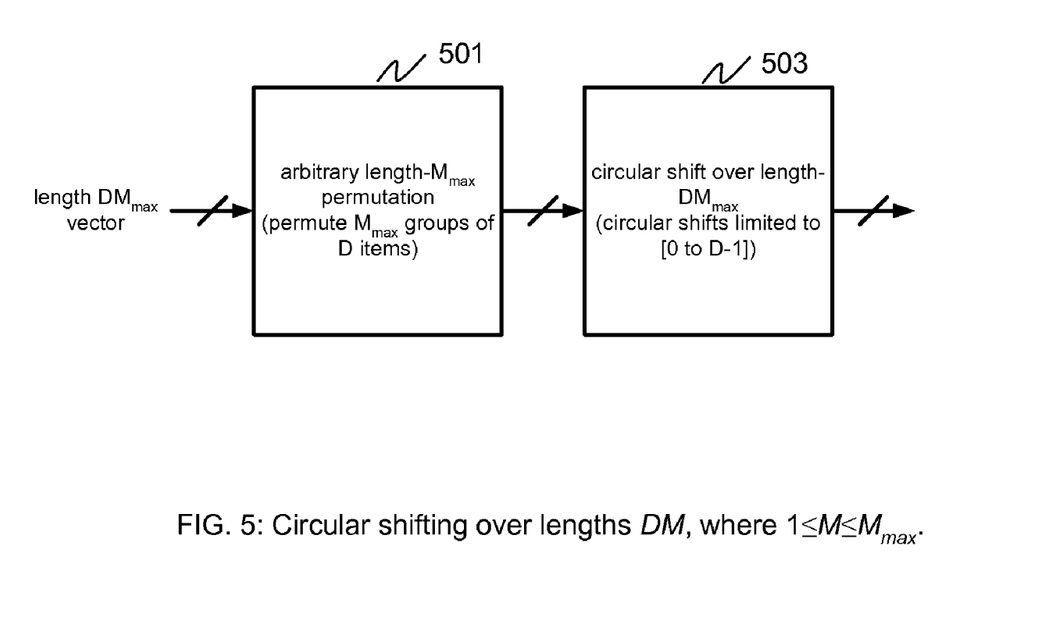

Cyclic shifting over arbitrary vector lengths essentially requires the ability to accommodate arbitrary permutations, and therefore does not permit circuit simplification. However, when the difference between vector lengths is fixed and non-unity the circuit can be partially simplified by dividing it into an arbitrary shift section 501 and a cyclic shift section 503. As illustrated in FIG. 5, a length-$DM_{max}$ vector can be cyclically shifted over sub-lengths DM, where D is the step size and $1 \leq M \leq M_{max}$, using an arbitrary permutation of $M_{max}$ groups of D followed by a cyclic shift between 0 and D-1, inclusive, over the length $DM_{max}$ result. The arbitrary permutation section requires $DM_{max}(M_{max}-1)$ 2-to-1 multiplexers and the cyclic shift section requires $M_{max}D\lceil \log_2(D) \rceil$ 2-to-1 multiplexers. Since $DM_{max}=z_0$, the total number of 2-to-1 multiplexers required for cyclic shifting over vector sizes DM, $1 \leq M \leq M_{max}$, is $z_0(M_{max}-1+\lceil \log_2(D) \rceil)$. Table 2 compares multiplexer counts for three combinations D and $M_{max}$. The first row in the table corresponds to the IEEE 802.16e scenario. This line shows that supporting cyclic shift over 24 different vector lengths requires 3.6 times as many multiplexers as required for supporting cyclic shifting over a single vector length.

TABLE 2

Multiplexer counts for three combinations of D and $M_{max}$.

| D | $M_{max}$ | 2-to-1 mux count | normalized mux count |
| --- | --- | --- | --- |
| 4 | 24 | $25z_0$ | 3.6 |
| 12 | 8 | $11z_0$ | 1.6 |
| 96 | 1 | $7z_0$ | 1 |

Encoding and Decoding

The encoding and decoding process when applying the LDPC codes designed with multi-model method is explained below.

Figure 6:
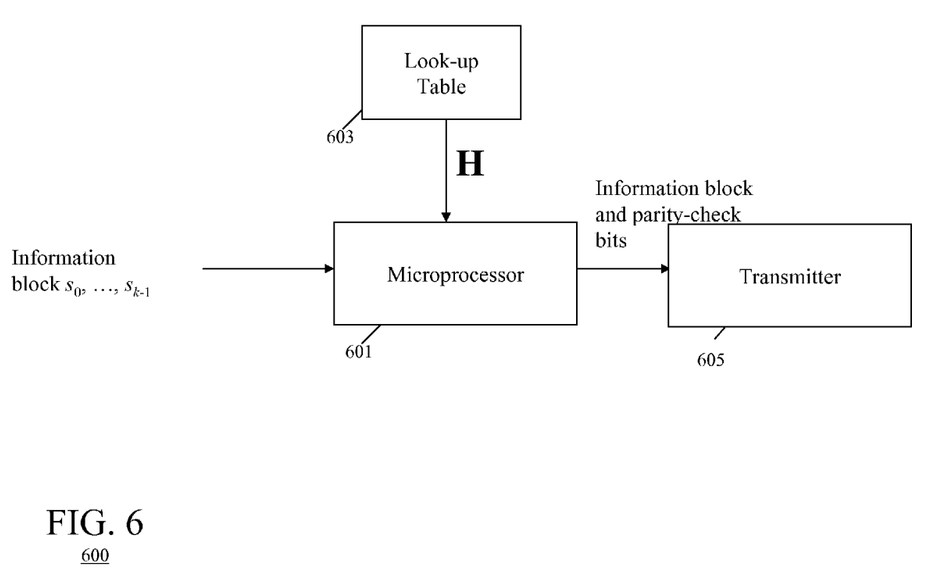
FIG. 6 is a block diagram of an encoder.

FIG. 6 is a block diagram of encoder 600 in accordance with a first embodiment of the present invention. As shown, encoder 600 comprises microprocessor (logic circuitry) 601 and lookup table 603. In the first embodiment of the present invention, microprocessor 601 comprises a digital signal processor (DSP), such as, but not limited to MSC8300 and DSP56300 DSPs. Additionally, lookup table 603 serves as storage means to store a matrix (or matrices), and comprises read-only memory; however, one of ordinary skill in the art will recognize that other forms of memory (e.g., random-access memory, magnetic storage memory, etc.) may be utilized as well. In a second embodiment, the functionality of the microprocessor 601 and the lookup table 603 can be incorporated into an application specific integrated circuit (ASIC) or field programmable gate array (FPGA). In particular, the lookup table 603 can be implemented in a form of memory corresponding to the existence or non-existence of signal paths in a circuit. With the multi-model method, the microprocessor 601 may only need to implement cyclic shift over one vector size.

As discussed above, encoded data is generally output as a plurality of parity-check bits in addition to the systematic bits, where together the parity-check and systematic bits form a codeword x. In the first embodiment of the present invention, multiple parity-check matrices H are stored in lookup table 603 which is accessed by microprocessor 601 to solve Equation (1). In particular, microprocessor 601 determines appropriate values for the parity-check bits $p=(p_0, \ldots, p_{m-1})$ based on the information block $s=(s_0, \ldots, s_{k-1})$ and the parity-check matrix H being utilized. The parity-check bits and the information block are then passed to a transmitter and transmitted to a receiver. As discussed above, H is an m by n matrix and an expansion of a model matrix $H_{bm}$ of size $m_b$ by $n_b$ and wherein $m=m_b \times z$ and $n=n_b \times z$. As discussed, parameters $m_b$, $n_b$ and z are selected based on the code rate and a current code size (i.e., the number of bits in the codeword after encoding). For a given code rate, the expansion factor, z, is preferably a factor of $z_0$ and both $n_b$ and z are taken from a group of possible values (see Table 1 for an example).

Figure 7:
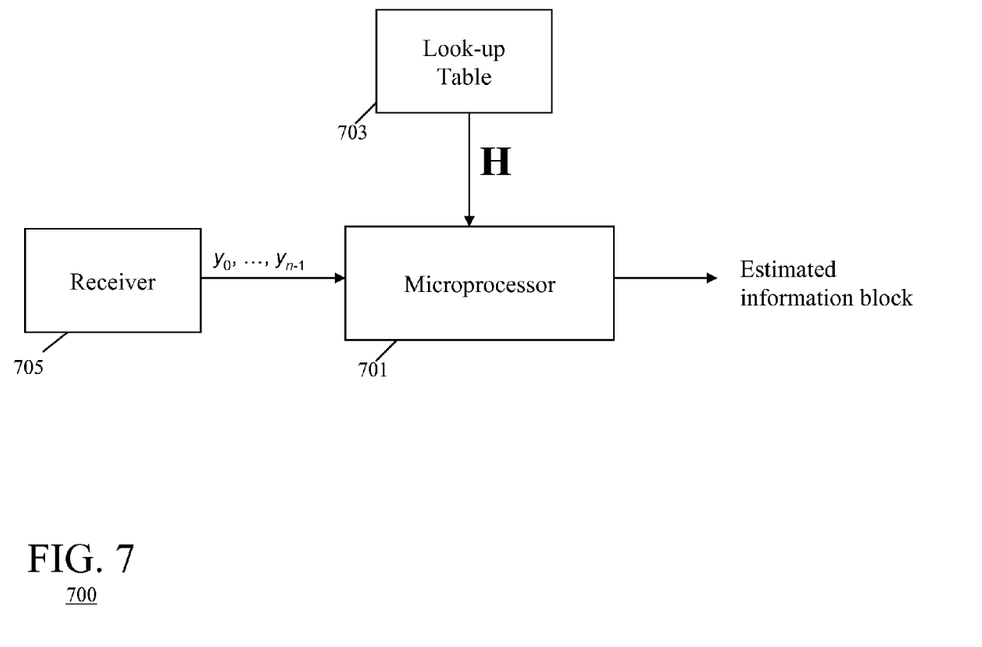
FIG. 7 is a block diagram of a decoder.

FIG. 7 is a block diagram of decoder 700 in accordance with one embodiment of the present invention. As shown, decoder 700 comprises microprocessor 701 and lookup table 703. In a first embodiment of the present invention, microprocessor 701 comprises a digital signal processor (DSP), such as, but not limited to MSC8300 and DSP57300 DSPs. Additionally, lookup table 703 acts as storage means for storing at least one matrix H, and comprises read-only memory. However, one of ordinary skill in the art will recognize that other forms of memory (e.g., random-access memory, magnetic storage memory, etc.) may be utilized as well. In a second embodiment, the functionality of the microprocessor 701 and the lookup table 703 can be incorporated into an application specific integrated circuit (ASIC) or field programmable gate array (FPGA). In particular, the lookup table 703 can be implemented in a form of memory corresponding to the existence or non-existence of signal paths in a circuit.

The received signal vector (received via a receiver) $y=(y_0, \ldots, y_{n-1})$ corresponds to the codeword x transmitted through a noisy channel, where the encoded data x, as discussed above, is a codeword vector. In the first embodiment of the present invention, a parity-check matrix H is stored in lookup table 703, and is accessed by microprocessor 701 to decode y and estimate the information block s (i.e., the information block $(s_0, \ldots, s_{k-1})$). In particular, microprocessor 701 estimates the information block $(s_0, \ldots, s_{k-1})$ based on the received signal vector $y=(y_0, \ldots, y_{n-1})$ and the parity-check matrix H. H is an m by n matrix and an expansion of a model matrix $H_{bm}$ of size $m_b$ by $n_b$ and wherein $m=m_b \times z$ and $n=n_b \times z$. As discussed, parameters $m_b$, $n_b$ and z are selected based on the code rate and a current code size. The expansion factor, z, is a preferably factor of $z_0$ and both $n_b$ and z are taken from a group of possible values (see Table 1 for an example).

As is well known in the art, there are many ways the decoder 700 can use the parity-check matrix H in the microprocessor 701 for decoding. One such way is to perform a vector-matrix multiplication with H to determine a likely error pattern. Another such way is to use H to construct a bipartite graph where the edges in the graph correspond to 1's in H, and to iteratively process y on the bipartite graph.

Figure 8:
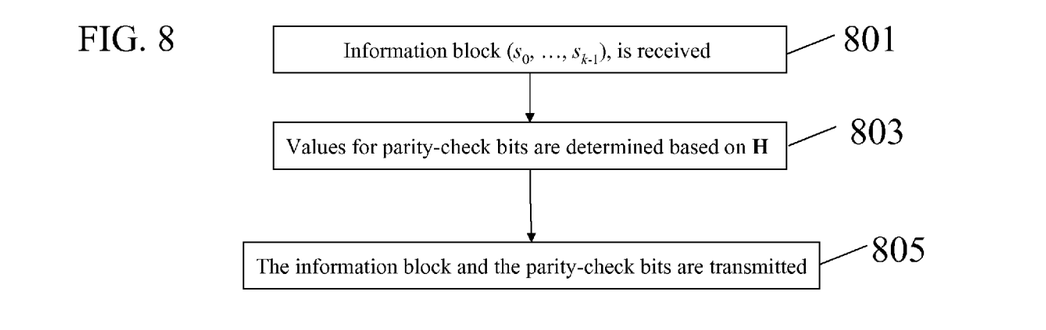
FIG. 8 is a flow chart showing operation of the encoder of FIG. 6.

FIG. 8 is a flow chart showing the operation of encoder 600, and in particular, microprocessor 601. Encoder 600 serves as a transmitter that generates parity-check bits $p=(p_0, \ldots, p_{m-1})$ based on an information block $s=(s_0, \ldots, s_{k-1})$. The logic flow begins at step 801 where an information block $(s_0, \ldots, s_{k-1})$ is received by microprocessor 601. At step 803, values of parity-check bits are determined based on the information block and H. At step 805 the parity-check bits are transmitted along with the information block. As discussed, H is an m by n matrix and an expansion of a model matrix $H_{bm}$ of size $m_b$ by $n_b$ and wherein $m=m_b \times z$ and $n=n_b \times z$. As discussed, parameters $m_b$, $n_b$ and z are selected based on the code rate and a current code size. The expansion factor, z, is preferably a factor of $z_0$ and both $n_b$ and z are taken from a group of possible values. In other words, $n_b$ is a value taken from a group of possible values for $n_b$ and z is a value taken from a group of possible values of z. Thus, model matrix size $n_b$ varies and expansion factor z varies to provide H matrices of different size.

Figure 9:
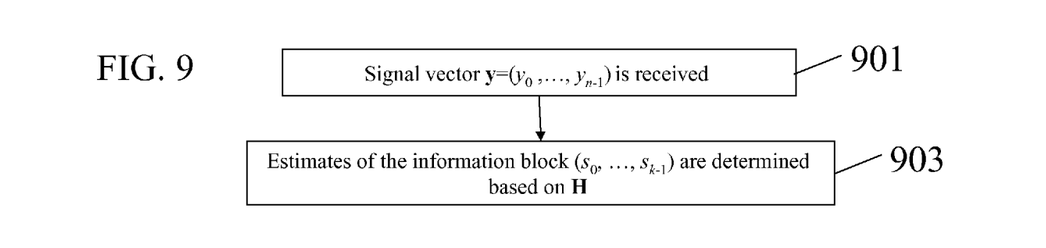
FIG. 9 is a flow chart showing operation f the decoder of FIG. 7.

FIG. 9 is a flow chart showing the operation of decoder 700, and in particular, microprocessor 701. Decoder 700 estimates a current symbol set $s=(s_0, \ldots, s_{k-1})$. The logic flow begins at step 901 where the received signal vector $y=(y_0, \ldots, y_{n-1})$ is received. At step 903, estimates of the information block s (i.e., the information block $(s_0, \ldots, s_{k-1})$) are determined based on H. As discussed, H is an m by n matrix and an expansion of a model matrix $H_{bm}$ of size $m_b$ by $n_b$ and wherein $m=m_b \times z$ and $n=n_b \times z$. As discussed, parameters $m_b$, $n_b$ and z are selected based on the code rate and a current code size. The expansion factor, z, is a factor of $z_0$ and both $n_b$ and z are taken from a group of possible values. In other words, $n_b$ is a value taken from a group of possible values for $n_b$ and z is a value taken from a group of possible values of z. Thus, model matrix size $n_b$ varies and expansion factor z varies to provide H matrices of different size.

While the invention has been particularly shown and described with reference to a particular embodiment, it will be understood by those skilled in the art that various changes in form and details may be made therein without departing from the spirit and scope of the invention. For example, the above discussion focused on decoders which are designed to process one vector row of the model matrix. However, the multi-model method discussed above is not limited to such matrices and such decoders. With certain constraints, matrices can be designed that allow multiple rows to be processed in parallel. The multi-model method can be applied to these designs as well. In another example, the method has been described using systematic encoding, where the information block is part of the codeword. However, the techniques can be applied to systems using non-systematic encoding as well. It is intended that such changes come within the scope of the following claims.

The invention claimed is:

1. A method for operating a transmitter that generates parity-check bits $p=(p_0, \ldots, p_{m-1})$ based on an information block $s=(s_0, \ldots, s_{k-1})$, the method comprising the steps of:
   receiving the information block $s=(s_0, \ldots, s_{k-1})$;
   using a matrix H to determine the parity-check bits; and
   transmitting the parity-check bits along with the information block;
   wherein H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes.

2. The method of claim 1 wherein the expansion factor z is a factor of $z_0$.

3. The method of claim 1 wherein $n_b$ is a value taken from a set of possible values for $n_b$ and z is a value taken from a set of possible values of z.

4. The method of claim 1 wherein expansion factor z varies with code size n.

5. The method of claim 1 wherein model matrix size $n_b$ varies with code size n.

6. The method of claim 1 wherein a model matrix $H_{bm}$ is derived from a mother model matrix by scaling operations.

7. The method of claim 1 wherein a model matrix $H_{bm}$ is derived from a mother model matrix by modulo operations.

8. The method of claim 1 wherein matrix H is used to obtain a second H matrix via shortening and/or puncturing.

9. The method of claim 1 wherein the encoder/decoder performs cyclic shifting for multiple vector sizes using the cyclic shift circuitry of a single vector length.

10. A method for estimating an information block $s=(s_0, \ldots, s_{k-1})$, the method comprising the steps of:
    receiving a signal vector $y=(y_0, \ldots, y_{n-1})$; and
    using a matrix H to estimate the information block $(s_0, \ldots, s_{k-1})$;
    wherein H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes.

11. The method of claim 10 wherein the expansion factor z is a factor of $z_0$.

12. The method of claim 10 wherein $n_b$ is a value taken from a set of possible values for $n_b$ and z is a value taken from a set of possible values of z.

13. The method of claim 10 wherein expansion factor z varies with code size n.

14. The method of claim 10 wherein model matrix size $n_b$ varies with code size n.

15. The method of claim 10 wherein a model matrix $H_{bm}$ is derived from a mother model matrix by scaling operations.

16. The method of claim 10 wherein a model matrix $H_{bm}$ is derived from a mother model matrix by modulo operations.

17. The method of claim 10 wherein matrix H is used to obtain a second H matrix via shortening and/or puncturing.

18. The method of claim 10 wherein the encoder/decoder performs cyclic shifting for multiple vector sizes using the cyclic shift circuitry of a single vector length.

19. An apparatus comprising:

logic circuitry receiving an information block $s=(s_0, \ldots, s_{k-1})$ and using a matrix H to determine parity-check bits, wherein H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes; and a transmitter transmitting the parity-check bits along with the information block.

20. An apparatus comprising:

a receiver receiving a signal vector $y=(y_0, \ldots, y_{n-1})$; and logic circuitry using a matrix H to estimate an information block $(s_0, \ldots, s_{k-1})$, wherein H is an m by n matrix and an expansion of a model matrix $H_{bm}$ of size $m_b$ by $n_b$ and wherein $m=m_b \times z$ and $n=n_b \times z$, and wherein model matrix size $n_b$ varies and expansion factor z varies for a given code rate, $1 \leq z \leq z_0$, to provide H matrices of different sizes.

* * * * *